United States Patent
Fontana et al.

(10) Patent No.: US 6,915,616 B2
(45) Date of Patent: Jul. 12, 2005

(54) FRAME MEMBER FOR ELECTRICAL DISTRIBUTION CABINETS

(75) Inventors: Rodolfo Fontana, Clivio (IT); Harry Schaaf, Greffern (DE)

(73) Assignees: ABB Service S.r.l. (IT); Striebel & John GmbH & Co. KG (DE)

( * ) Notice: Subject to any disclaimer, the term of this patent is extended or adjusted under 35 U.S.C. 154(b) by 0 days.

(21) Appl. No.: 10/375,107

(22) Filed: Feb. 28, 2003

(65) Prior Publication Data

US 2003/0172613 A1 Sep. 18, 2003

(30) Foreign Application Priority Data

Mar. 6, 2002 (IT) ..................................... MI2000A0473

(51) Int. Cl.[7] ............................................... E04C 3/30
(52) U.S. Cl. ................... 52/731.2; 52/732.1; 312/265.1
(58) Field of Search ............................. 52/731.2, 731.4, 52/732.1, 732.3, 287.1, 717.01; 312/265.1, 265.2, 265.3, 265.4

(56) References Cited

U.S. PATENT DOCUMENTS 4,643,319 A * 2/1987 Debus et al. ............... 211/189
5,791,115 A * 8/1998 Nicolai et al. ............. 52/730.4
5,930,972 A   8/1999 Benner et al.
6,419,331 B2 * 7/2002 Wei .......................... 312/265.1
6,428,127 B1 * 8/2002 Rasmussen ............... 312/265.4

FOREIGN PATENT DOCUMENTS

| DE | 3939421 C1 * | 10/1990 | ............. 312/265.1 |
| EP | 0 800 250 A2 | 10/1997 | |
| EP | 0 872 930 A2 | 10/1998 | |
| EP | 1 052 750 A1 | 11/2000 | |
| GB | 2121676 A * | 1/1984 | ............. A47F/3/00 |
| WO | WO 01/91529 A1 | 11/2001 | |

OTHER PUBLICATIONS

European Search Report dated Mar. 24, 2004 in corresponding European Patent Application No. EP 03 07 5620.

* cited by examiner

*Primary Examiner*—Naoko Slack
(74) *Attorney, Agent, or Firm*—Connolly, Bove, Lodge & Hutz LLP

(57) ABSTRACT

A frame member for electrical distribution cabinets, whose particularity consists of the fact that it has a substantially triangular transverse cross-section and that it has two ribs, which are arranged longitudinally along the extension of the frame member and are suitable to allow the engagement of a finishing element for finishing the frame member.

9 Claims, 5 Drawing Sheets

FRAME MEMBER FOR ELECTRICAL DISTRIBUTION CABINETS

FIELD OF THE INVENTION

The present invention relates to electrical distribution cabinets and in particular to a frame member for electrical distribution cabinets. More particularly, the invention relates to a frame member that is suitable for use both as a horizontal member and as a vertical member for electrical distribution cabinets.

BACKGROUND OF THE INVENTION

As is known, electrical distribution cabinets are constituted by a frame formed by vertical and horizontal members and by panels that form side walls, the rear wall, the top and the bottom of the cabinet.

Electrical distribution cabinets can have a door or not, and if a door is provided, hinges must be arranged at the vertical frame members so as to allow to fix said door.

In both cases, in electrical distribution cabinets with and without a door, the frame members must be finished so as to be able to offer a pleasant aesthetic effect to the cabinet.

Essentially, it is necessary to add to each frame member external finishing elements, with difficulties in engagement with said frame member.

SUMMARY OF THE INVENTION

The aim of the present invention is to provide a frame member for an electrical distribution cabinet that allows to couple thereto member finishing elements, without adding any additional element to said frame member apart from the finishing element.

Within the scope of this aim, an object of the present invention is to provide a frame member for electrical distribution cabinets that can be used both as a vertical member and as a horizontal member.

Another object of the present invention is to provide a frame member for electrical distribution cabinets whose transverse cross-section helps to increase its rigidity.

Another object of the present invention is to provide a frame member for electrical distribution cabinets that is highly reliable, relatively simple to manufacture and at competitive costs.

This aim, these objects and others that will become better apparent hereinafter are achieved by a frame member for electrical distribution cabinets, whose particularity consists of the fact that it has a substantially triangular transverse cross-section and that it has two ribs, which are arranged longitudinally along the extension of the frame member and are suitable to allow the engagement of a finishing element for finishing said frame member.

For a better understanding of the present invention, reference is made to the accompanying drawings and to the detailed description hereinafter, in which preferred but non-limitative embodiments of the differential pressure transmitter according to the present invention are illustrated.

DESCRIPTION OF THE PREFERRED EMBODIMENTS

Figures 1, 2:
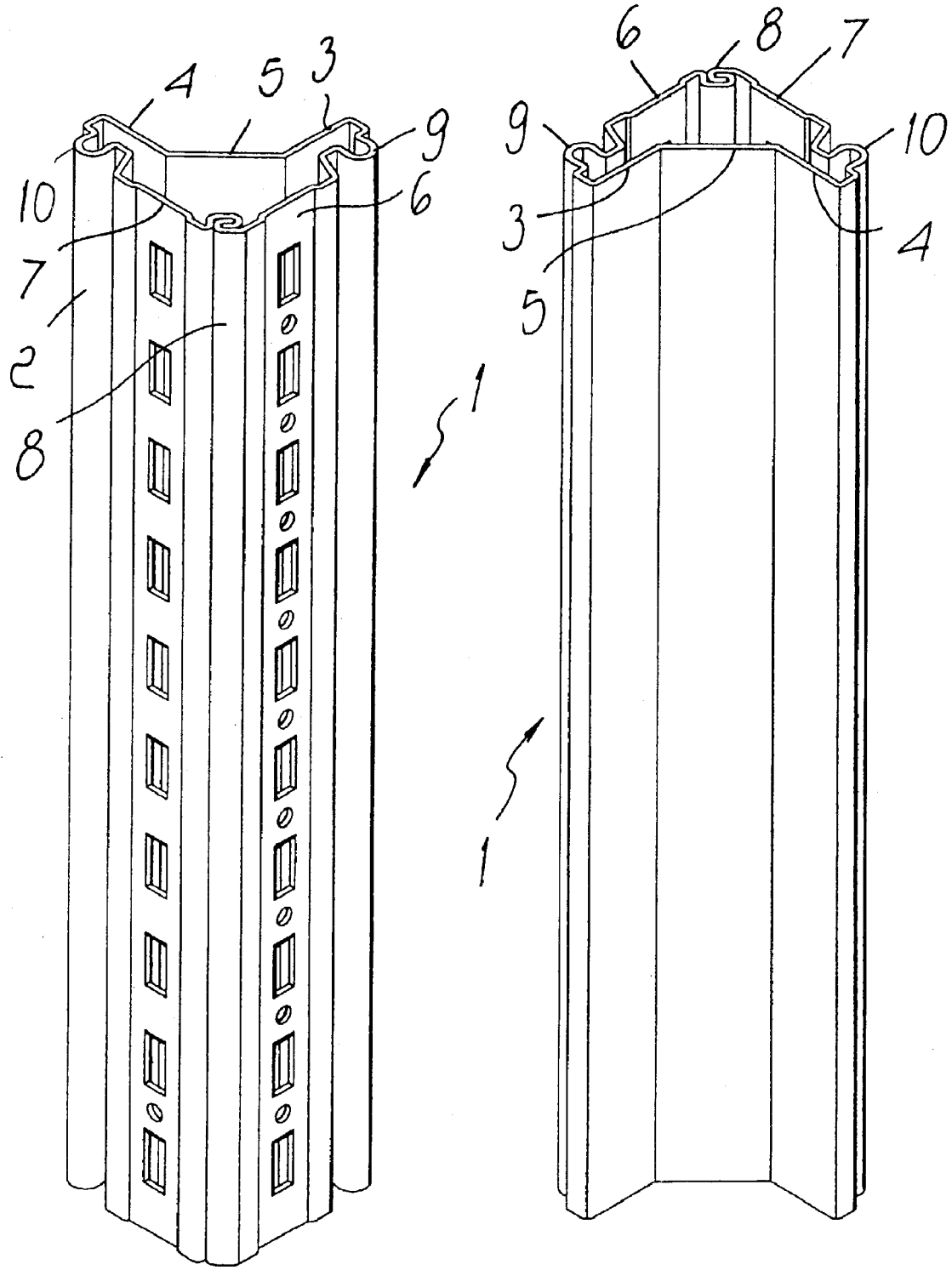
FIG. 1 is a perspective view of the frame member according to the present invention.
FIG. 2 is a perspective view, taken from the opposite side with respect to FIG. 1, of the frame member according to the present invention.
Figure 3:
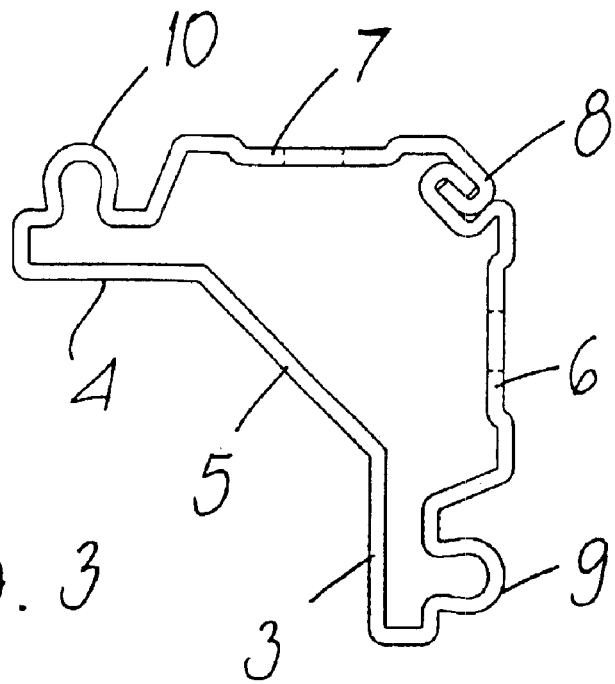
FIG. 3 is a transverse sectional view of the frame member according to the present invention.

With reference to the figures cited above, the frame member according to the present invention, generally designated by the reference numeral 1, comprises a substantially triangular profiled element 2, which comprises two first portions 3 and 4 which are angled and are connected by means of a portion 5 that forms an obtuse angle with the two angled portions 3 and 4. The triangular structure, in transverse cross-section, of the frame member 1 also comprises two additional portions 6 and 7, which constitute the remaining two sides of the triangle and protrude without discontinuities starting from the two portions 3 and 4 respectively. The two portions 6 and 7 are mutually joined for example by folding over the profiled element, as shown in the accompanying figures, or can be welded at the vertex of the triangle by virtue of any kind of welding. As an alternative, the profiled element can be closed at the portion 5 that lies opposite the vertex 8 of the triangular cross-section of the profiled element.

In all of the cases described above, the structure of the profiled element according to the invention has two ribs 9 and 10, which are respectively arranged at the corners between the portions 6 and 3 and between the portions 7 and 4.

Figure 4:
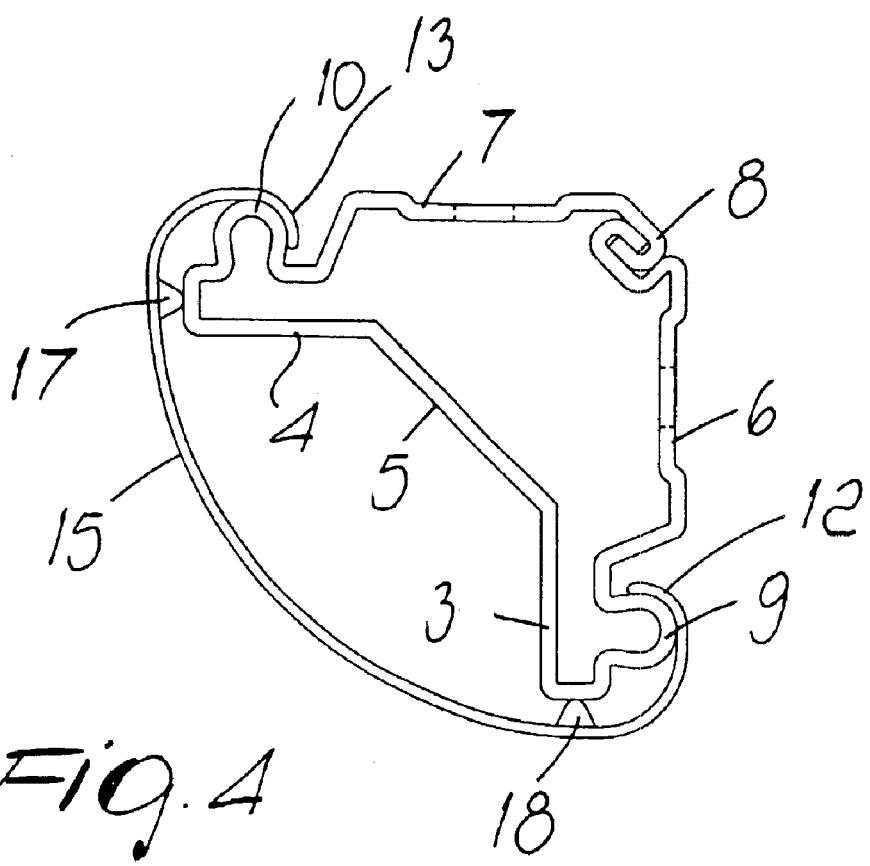
FIG. 4 is a transverse sectional view of the frame member according to the invention, with the addition of a member finishing element.
Figure 5:
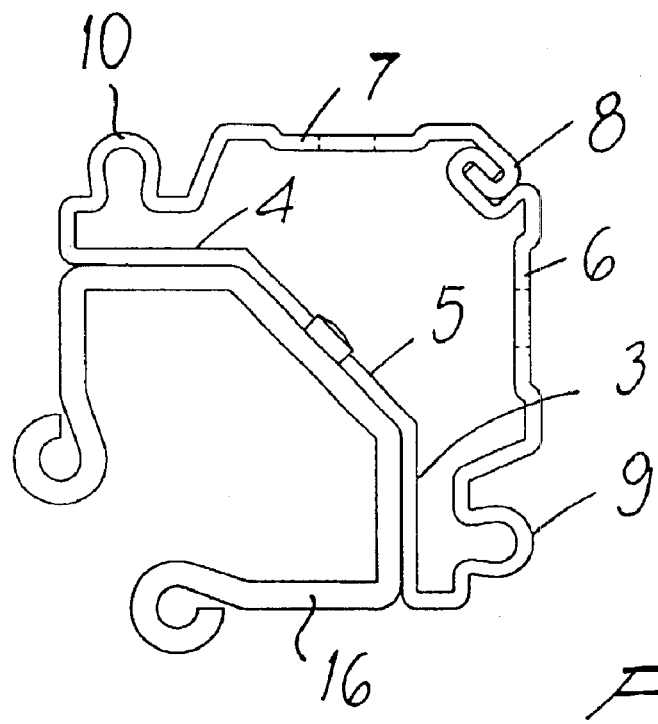
FIG. 5 is a transverse sectional view of the frame member according to the present invention, with a hinge for applying a door associated therewith.

The ribs 8 and 9 perform a dual function: on the one hand, they allow to stiffen the structure of the profiled element, since they are arranged longitudinally along the extension of said profiled element; on the other hand, they allow to provide engagement means for a member finishing element, which is shown for example in FIG. 4 and is designated by the reference numeral 15.

The finishing element 15 is constituted by an arc-like portion, which is provided with curved ends 12 and 13 that are suitable to engage the ribs 9 and 10 respectively, as shown for example in FIG. 4.

The ribs 9 and 10 are shown to have a substantially circular cross-section, in order to allow the engagement of the curved portions 12 and 13 of the finishing element 15. However, the ribs may also have different shapes and in this case the finishing element 15 is shaped accordingly in order to engage said ribs.

The presence of the pair of ribs 9 and 10 therefore allows to engage the finishing elements 15 without having to resort to additional elements to be associated with the profiled element, thus making it extremely quick to apply the finishing element and cheap to manufacture the frame member according to the present invention.

Moreover, the frame member according to the present invention can be provided with one or more hinges 16, as shown in FIGS. 5, 6, 7, 8 and 9 to 11. Said hinges 16 allow to apply a door to the frame member so as to close the electrical distribution cabinet.

Figure 6:
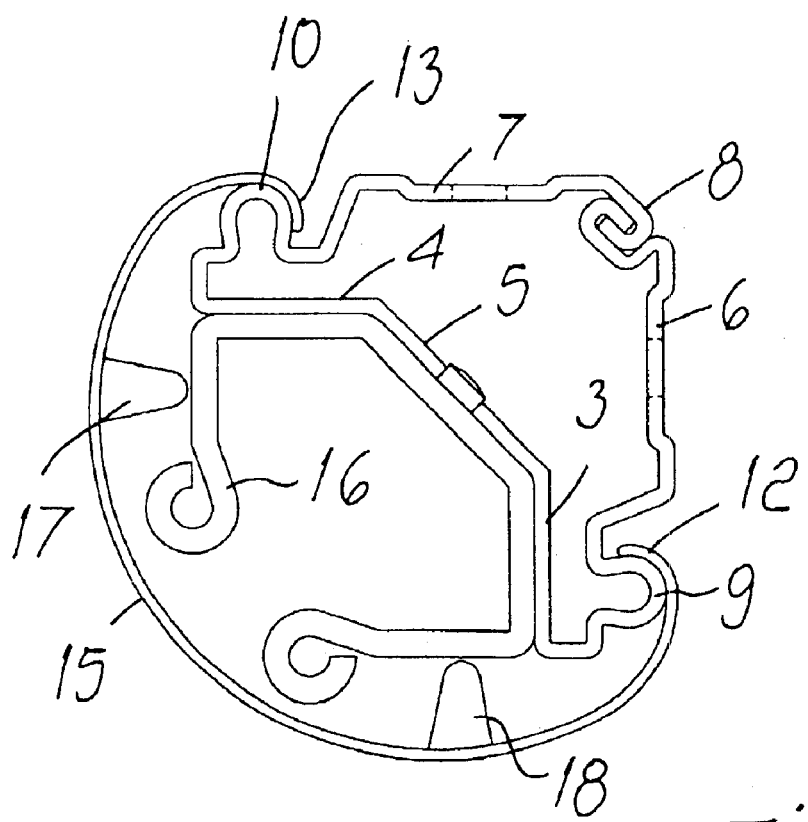
FIG. 6 is a transverse sectional view, similar to FIG. 5, with the addition of a member finishing element.

Even if the hinges are used, and if they are not to be used to engage a door, i.e., when the electrical distribution cabinet, despite having frame members that are preset for the engagement of a door, must be produced according to the door-less model, the finishing element 15 can still be applied in order to engage the ribs 9 and 10, as shown for example in FIG. 6.

Figure 7:
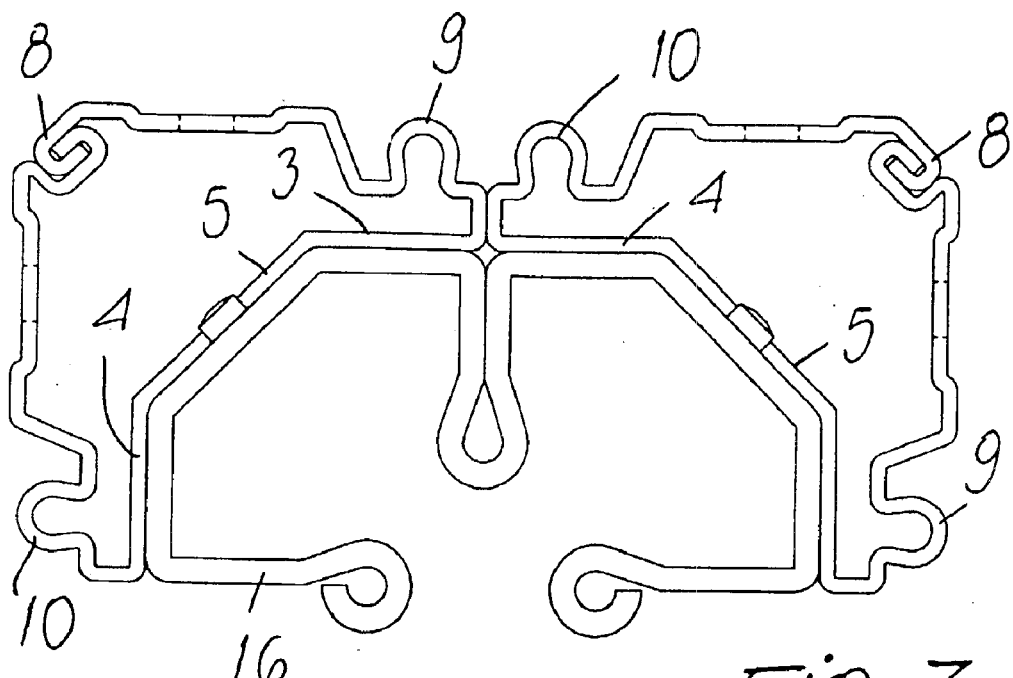
FIG. 7 is a transverse sectional view of a pair of frame members connected by means of a hinge for the application of a door.
Figure 8:
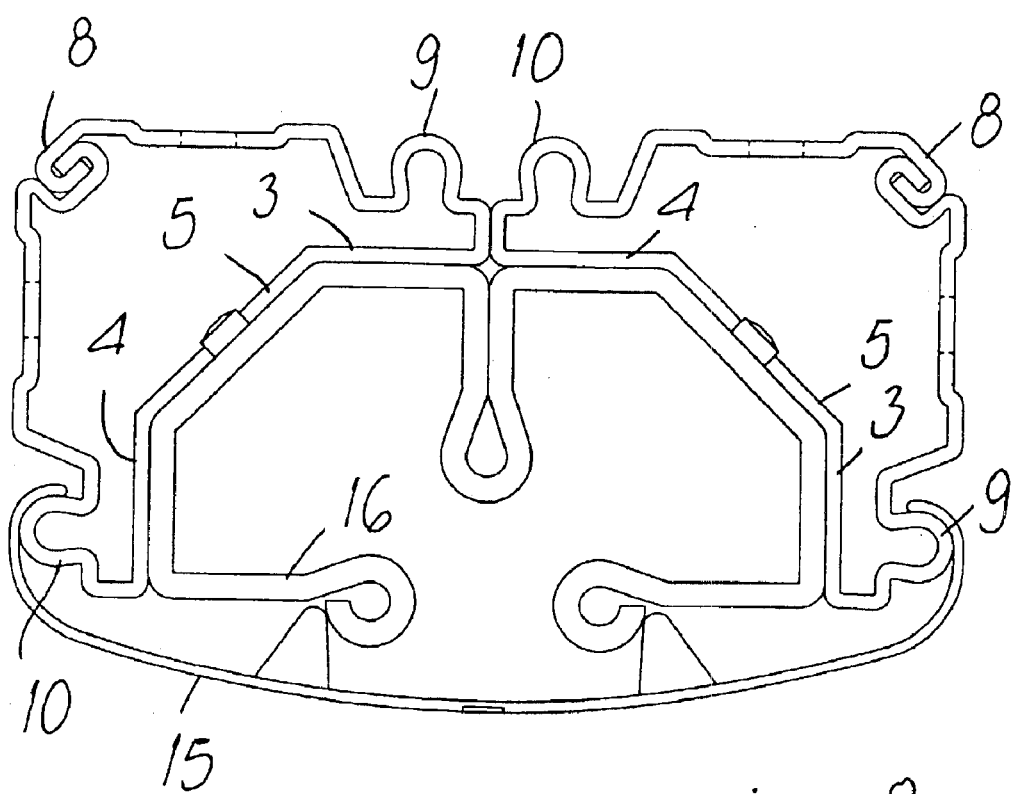
FIG. 8 is a transverse sectional view of the frame member of FIG. 7, with an element for finishing the pair of frame members coupled thereto.
Figure 11:
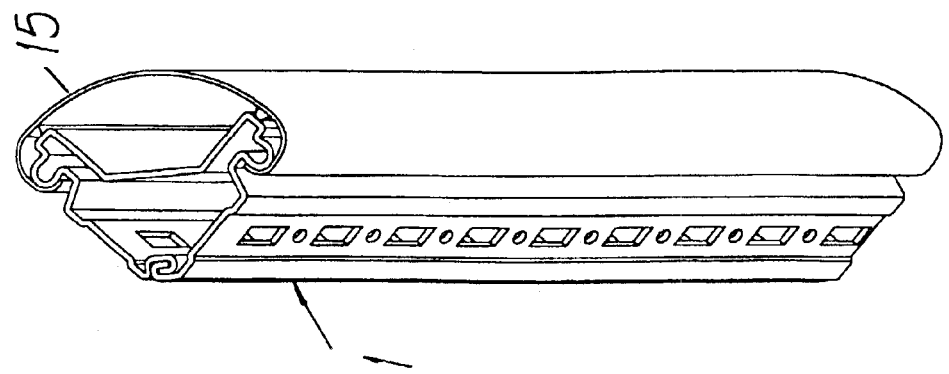
FIG. 11 is a perspective view of the frame member shown in FIG. 4.
Figure 10:
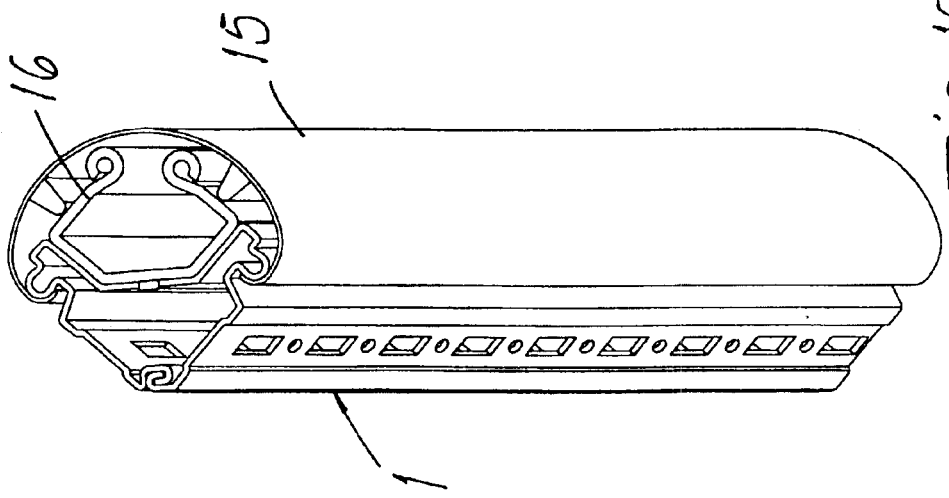
FIG. 10 is a perspective view of the frame member shown in FIG. 6.
Figure 9:
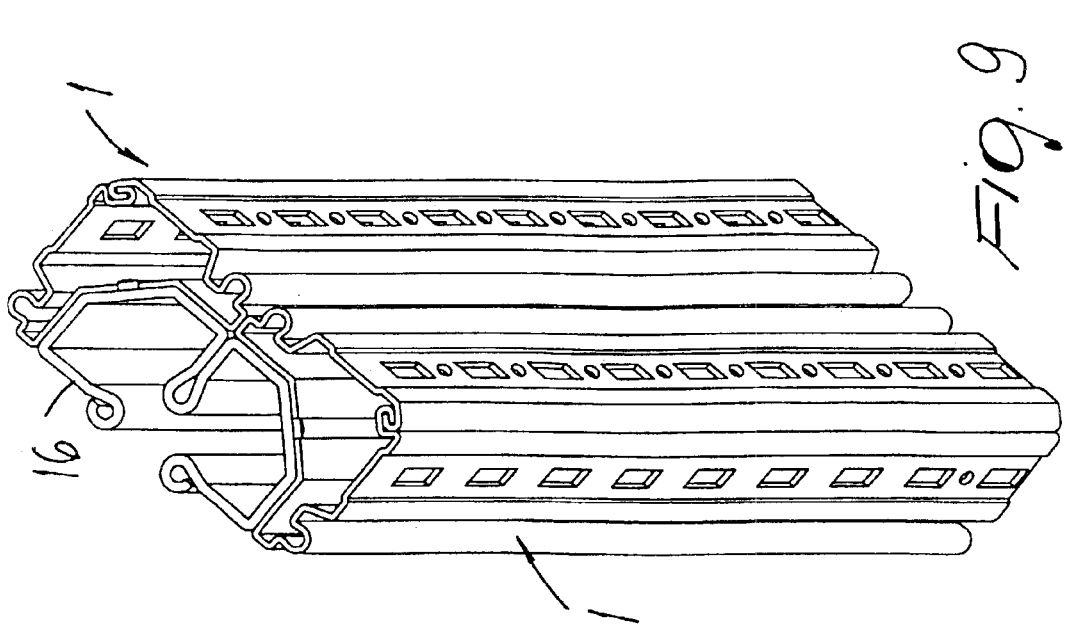
FIG. 9 is a perspective view of the pair of frame members shown in FIG. 7.

FIGS. 7 and 8 illustrate two frame members according to the present invention, mutually associated by virtue of the hinge 16 and, FIG. 8, with the finishing element 15, which can be equally engaged to the ribs 9 and 10 of two distinct associated frame members.

Conveniently, the finishing element 15 can be provided with a pair of cusps 17 and 18, which are suitable to rest against the edges of the triangular cross-section of the frame member or, if a hinge 16 is present, against said hinge.

Clearly, the presence of cusps is absolutely not necessary for correct application of the finishing element 15, which requires, for its fixing, only the presence of the ribs 9 and 10.

In practice it has been found that the frame member according to the present invention fully achieves the intended aim and objects, since it can be produced with a particular transverse cross-section, which has two ribs which, in addition to stiffening said frame member, allow to couple to said frame member a finishing element, if the frame member is to be used for electrical distribution cabinets without the door. The frame member thus conceived is susceptible of numerous modifications and variations, all of which are within the scope of the inventive concept; all the details may furthermore be any according to the requirements and the state of the art.

We claim:

1. A frame member for electrical distribution cabinets, said frame member comprising:
   a profiled element having:
   a substantially triangular-shaped transverse cross-section, wherein said substantially triangular-shaped transverse cross-section has a first side which comprises a central portion, a first portion and a second portion which are angled with respect to said central portion and are connected by said central portion, wherein said central portion forms an obtuse angle with said first portion and said second portion, respectively, and wherein said substantially triangular-shaped transverse cross-section comprises second and third sides which comprise a third portion and a fourth portion, respectively, wherein said third portion and said fourth portion protrude from the first portion and the second portion, respectively, and are mutually joined at a first corner of the triangular-shaped transverse cross-section; and
   a first rib and a second rib which are arranged to allow the engagement of a finishing element for finishing said frame member, wherein said first rib and said second rib extend longitudinally along the extension of the frame member and are arranged along said third portion and said fourth portion at corners between the first portion and the third portion and between the second portion and the fourth portion, respectively.

2. The frame member according to claim 1, wherein said third and fourth portions are welded at said first corner.

3. The frame member according to claim 1, wherein said third and fourth portions are mutually coupled by folding back said profiled member.

4. The frame member according to claim 1, wherein said third and fourth portions protrude without discontinuities from said first and second angled portions.

5. The frame member according to claim 1, wherein said profiled element is welded at said central portion.

6. The frame member according to claim 1, wherein said frame member is engaged with said finishing element, wherein said finishing element is curved and wherein ends of said finishing element are curved so as to engage at said ribs.

7. The frame member according to claim 1, wherein said ribs have a curved transverse cross-section.

8. The frame member according claim 1, wherein said frame member is coupled to at least one hinge, said hinge having a shape that is complimentary to the profile of said first and second angled portions and being fixed to said frame member at said central portion.

9. The frame member according to claim 8, wherein said frame member is engaged with said finishing element, and wherein said finishing element comprises two cusps that allow said finishing element to rest on edges of said triangular-shaped transverse cross-section of the frame member or on said hinge.

* * * * *